(12) United States Patent
Endo et al.

(10) Patent No.: US 8,776,542 B2
(45) Date of Patent: Jul. 15, 2014

(54) COOLING SYSTEM

(75) Inventors: Tetsuya Endo, Komae (JP); Einstein Noel Abarra, Hachioji (JP)

(73) Assignee: Canon Anelva Corporation, Kanagawa-Ken (JP)

( * ) Notice: Subject to any disclaimer, the term of this patent is extended or adjusted under 35 U.S.C. 154(b) by 703 days.

(21) Appl. No.: 12/975,962

(22) Filed: Dec. 22, 2010

(65) Prior Publication Data
US 2011/0155569 A1 Jun. 30, 2011

(30) Foreign Application Priority Data
Dec. 25, 2009 (JP) ................. 2009-296350

(51) Int. Cl.
*F25D 23/12* (2006.01)
*H05K 7/20* (2006.01)
*F25D 25/02* (2006.01)

(52) U.S. Cl.
CPC ........ *H05K 7/20009* (2013.01); *H05K 7/20372* (2013.01); *H05K 7/20545* (2013.01); *F25D 25/027* (2013.01)
USPC ...................................................... 62/259.2

(58) Field of Classification Search
CPC .......... H05K 7/20009; H05K 7/20372; H05K 7/20545; F25D 25/027
USPC ...................................................... 62/259.2
See application file for complete search history.

(56) References Cited

U.S. PATENT DOCUMENTS

| | | | | |
|---|---|---|---|---|
| 5,121,292 A * | 6/1992 | Bell et al. | ...................... | 174/15.4 |
| 5,950,444 A * | 9/1999 | Matsunaga | .................... | 62/259.2 |
| 5,996,353 A * | 12/1999 | Maxwell et al. | ............ | 62/259.2 |
| 6,032,476 A * | 3/2000 | Pfister et al. | ................. | 62/259.2 |
| 6,089,311 A * | 7/2000 | Edelson | ....................... | 62/259.2 |
| 6,138,469 A * | 10/2000 | Davidson et al. | ............ | 62/259.2 |
| 6,279,337 B1 * | 8/2001 | Davidson et al. | ............ | 62/259.2 |
| 6,497,110 B2 * | 12/2002 | Davidson et al. | ............ | 62/259.2 |
| 6,634,177 B2 * | 10/2003 | Lin et al. | ...................... | 62/259.2 |
| 6,705,095 B2 * | 3/2004 | Thompson et al. | .......... | 62/259.2 |
| 6,986,261 B2 * | 1/2006 | Sasaki et al. | ................. | 62/259.2 |
| 7,000,416 B2 * | 2/2006 | Hirooka et al. | .............. | 62/259.2 |
| 7,127,906 B2 * | 10/2006 | Coursaget | .................... | 62/259.2 |
| 7,216,496 B2 * | 5/2007 | Yamazaki | .................... | 62/259.2 |
| 7,461,794 B2 * | 12/2008 | Le et al. | ....................... | 62/259.2 |
| 7,785,449 B2 | 8/2010 | Endo et al. | | |
| 7,797,960 B2 * | 9/2010 | Onoue | ......................... | 62/259.2 |

(Continued)

FOREIGN PATENT DOCUMENTS

| | | |
|---|---|---|
| JP | 2003-201565 A | 7/2003 |
| JP | 2008-156746 A | 7/2008 |

OTHER PUBLICATIONS

Djayaprawira et al., "230% Room-Temperature Magnetoresistance in CoFeB/MgO/CoFeB Magnetic Tunnel Junctions" Applied Physics Letters, (2005), vol. 86, pp. 092502-1-092502-3.

*Primary Examiner* — Ljiljana Ciric
(74) *Attorney, Agent, or Firm* — Buchanan Ingersoll & Rooney PC

(57) ABSTRACT

A cooling system that cools a wafer in a vacuum chamber of a sputtering apparatus, includes a wafer cooling stage for cooling the wafer, a cooling mechanism for cooling the wafer cooling stage, cooling gas supply units which introduces a cooling gas to the wafer cooling stage, a wafer rotating mechanism which holds the wafer in a state separated from the wafer cooling stage by a predetermined gap, and is rotated while holding the wafer, and a driving mechanism which rotates the wafer rotating mechanism at a predetermined rotational speed.

12 Claims, 12 Drawing Sheets

(56) References Cited

U.S. PATENT DOCUMENTS

| | | | |
|---|---|---|---|
| 7,805,954 B2* | 10/2010 | Yamanaka et al. | 62/259.2 |
| 7,984,618 B2* | 7/2011 | Kudo | 62/259.2 |
| 2008/0258411 A1 | 10/2008 | Miura et al. | |
| 2010/0096568 A1 | 4/2010 | Abarra et al. | |
| 2010/0108495 A1 | 5/2010 | Abarra | |
| 2010/0108496 A1 | 5/2010 | Abarra | |

* cited by examiner

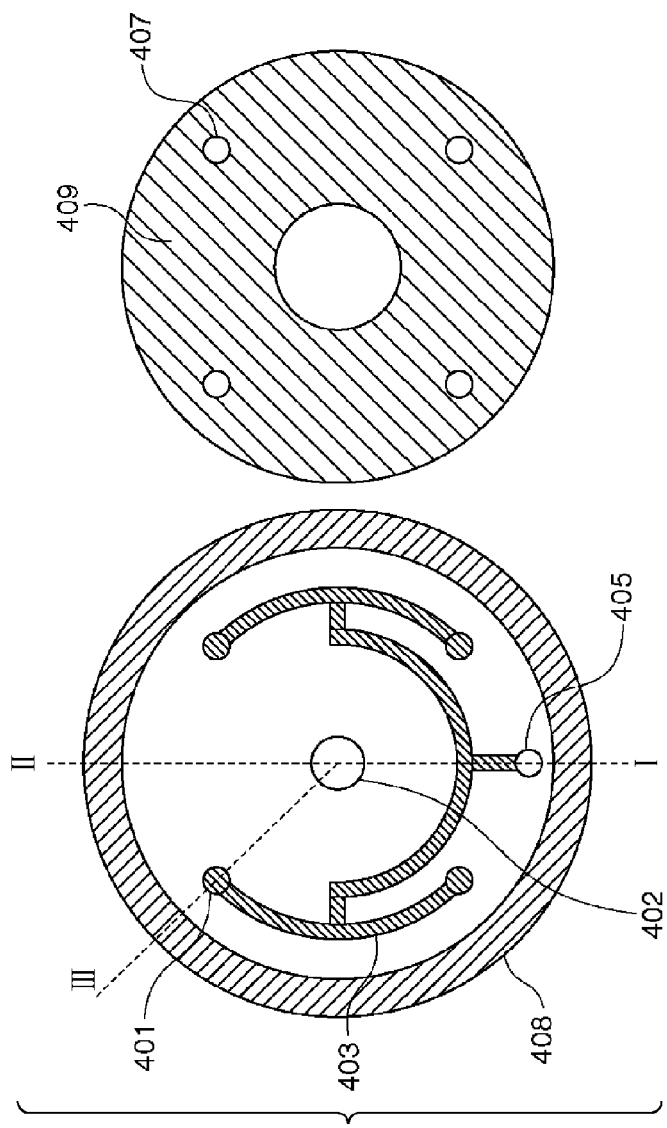
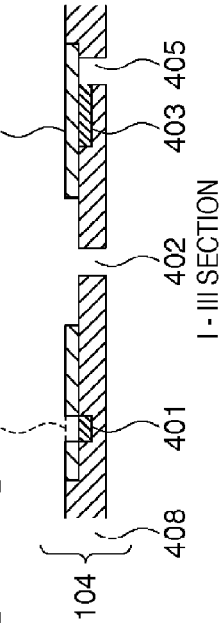
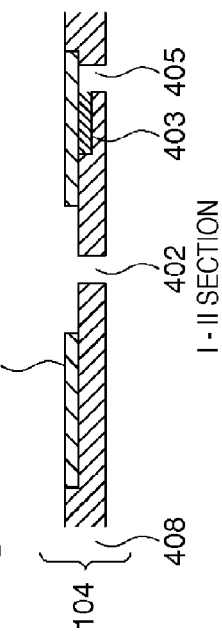
FIG. 4A
FIG. 4B
FIG. 4C

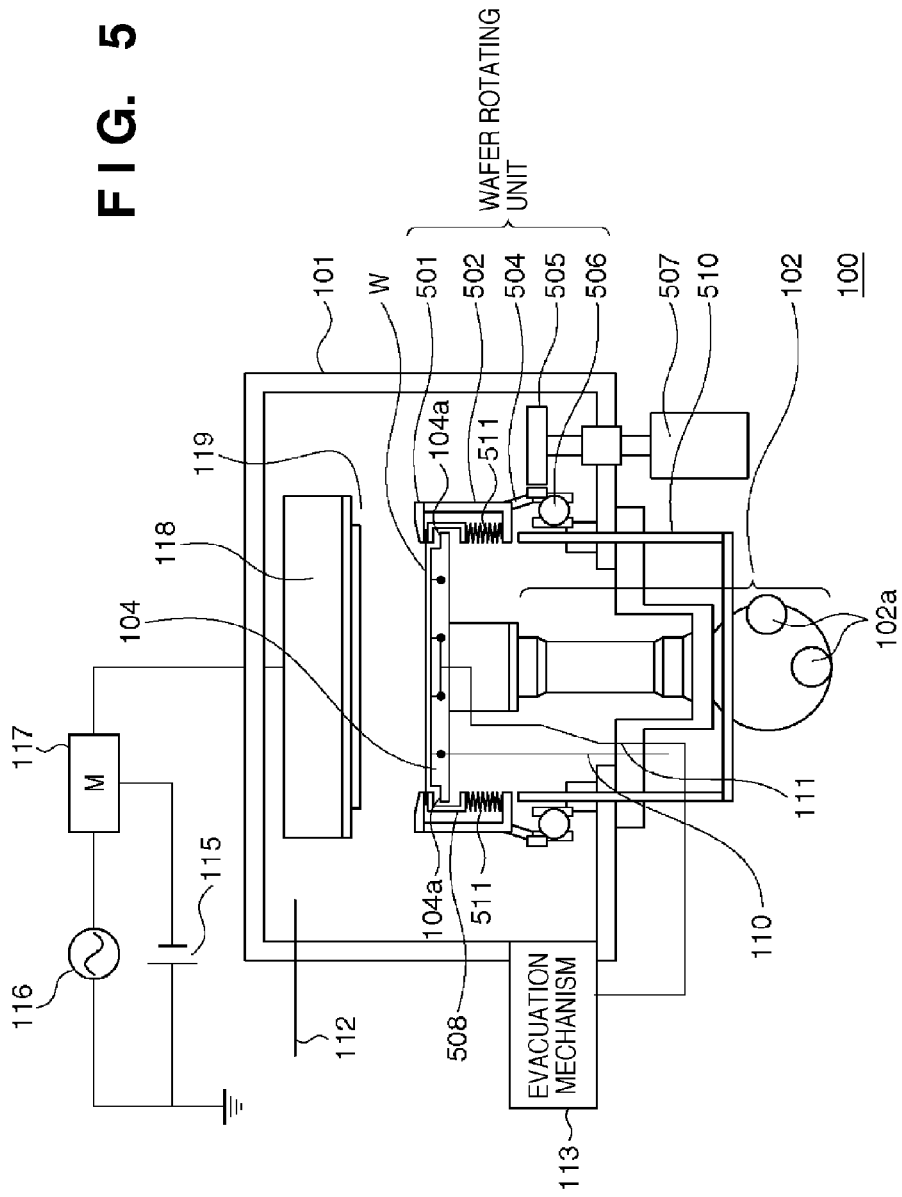

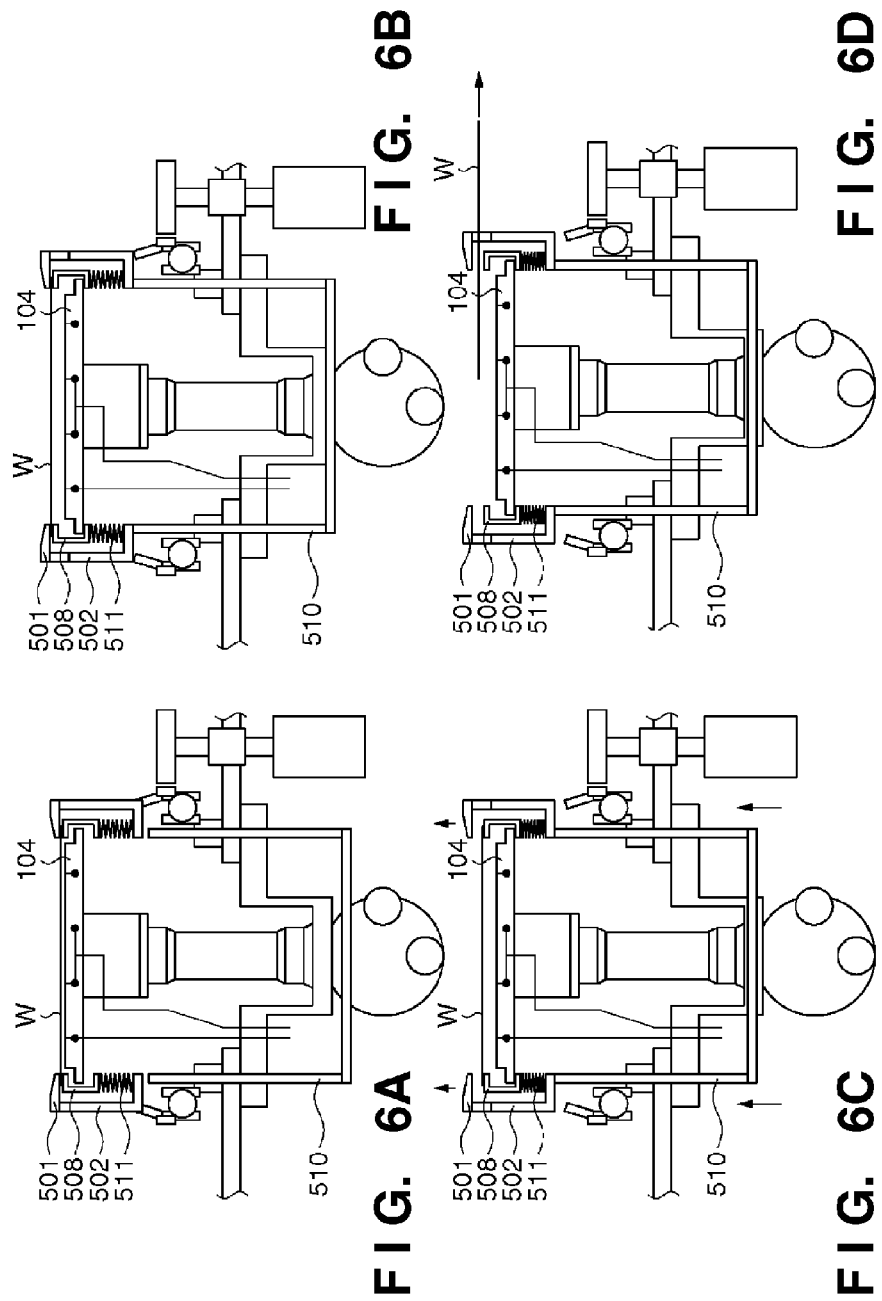

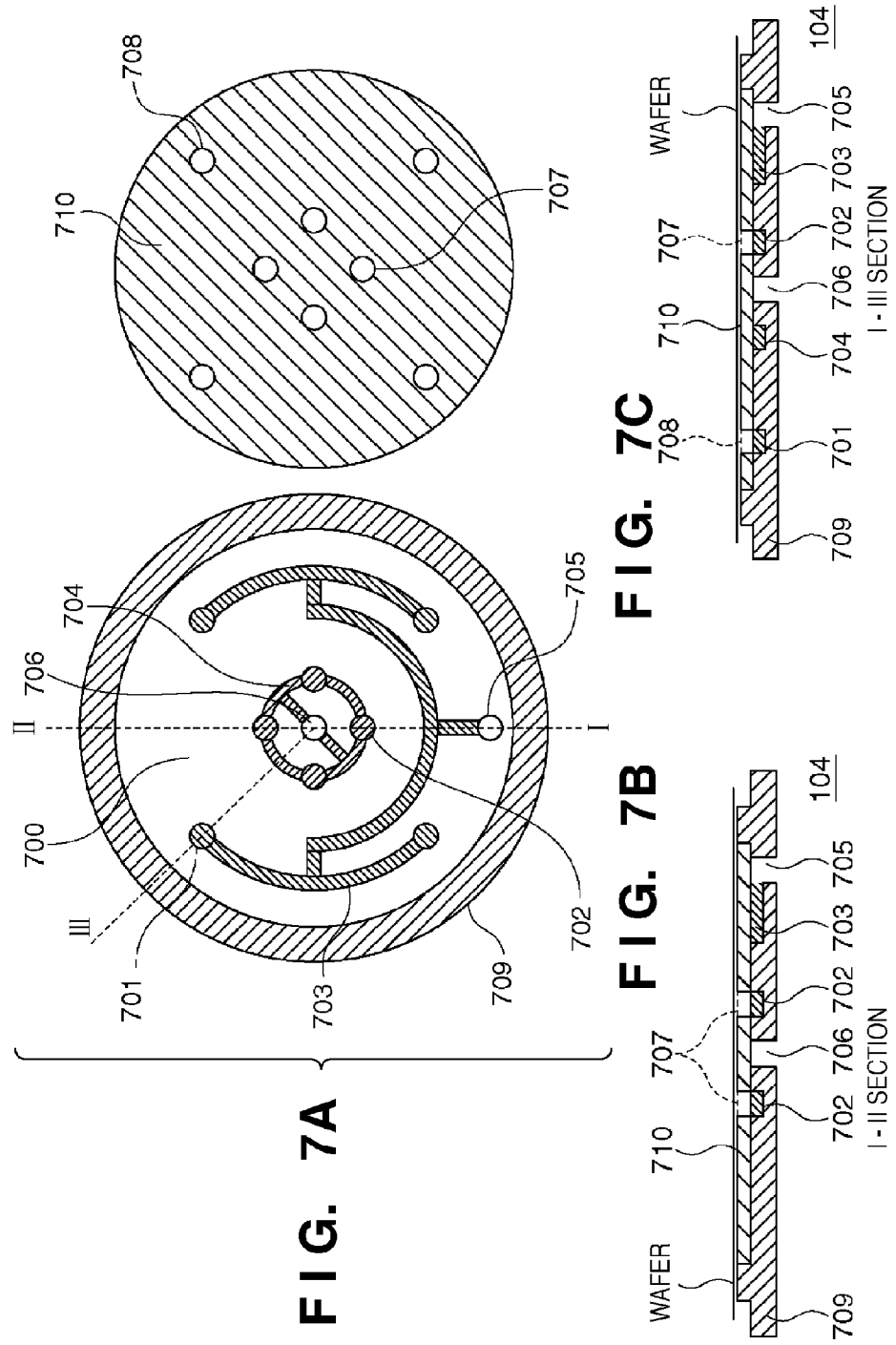

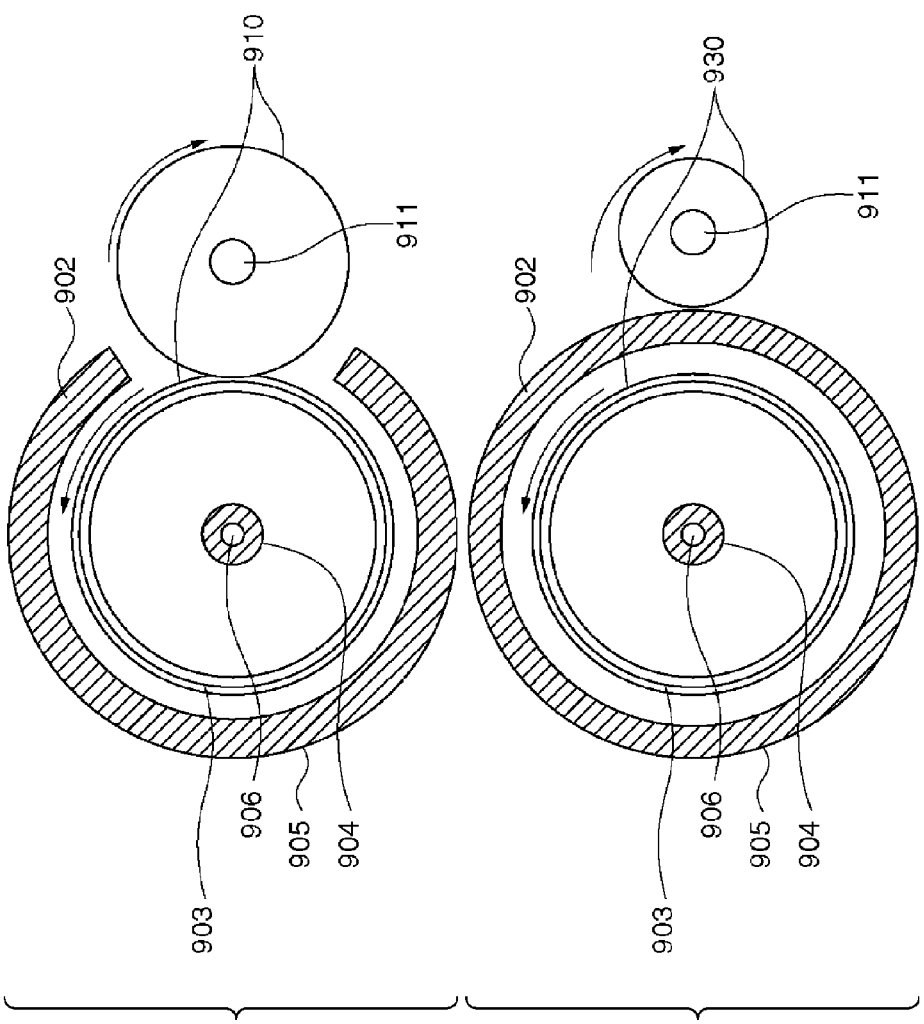

COOLING SYSTEM

BACKGROUND OF THE INVENTION

1. Field of the Invention

The present invention relates to a technique for cooling a wafer.

2. Description of the Related Art

The recording density of a magnetic recording/reproducing apparatus must be improved, while a magnetic recording/reproducing head that is used to convert a magnetic signal recorded onto an electric signal must also achieve higher performance. Taking, as an example, improving a sensitivity enhancement technique for technical issues about a magnetic recording/reproducing head, a sensor using a tunnel magnetic resistance effect (TMR) with a very high MR ratio is prevalent, and its development has advanced.

For example, as described in a reference; APPLIED PHYSICS LETTERS 86, 092502 (2005), David, et. al., an amorphous film is formed by forming an FeCoB film at room temperature, and an MgO film is formed on this amorphous film upon forming a magnetic tunnel junction (MTJ). An FeCoB amorphous film is formed on this MgO film, and this FeCoB/MgO/FeCoB multilayered structure undergoes a heat treatment at 360° C. for two hours, thus preparing a TMR film which exhibits a 230% magnetic resistance change. This is for the following reason. The amorphous film is formed by forming the FeCoB film at room temperature, and the MgO film is formed on this amorphous FeCoB film to obtain an MgO (001) structure. When the multilayered structure formed by sandwiching the FeCoB film by the MgO films undergoes a heat treatment, FeCo of the FeCoB film crystallizes using the MgO films as a template.

On the other hand, the above reference analyzes a crystal structure by forming an MTJ of an FeCo/MgO/FeCo multilayered structure in place of the FeCoB film as a comparative example. As described in this reference, as a result of this analysis, a CoFe film does not have an amorphous structure by forming it at room temperature, and an MgO film formed on that CoFe film does not have any (001) crystal face.

Also, when a wafer undergoes film formation at a low temperature (for example, a minus region), a possibility of formation of an amorphous film is expected. This is because sputter particles lose their energies by the low-temperature wafer simultaneously with attachment to the wafer, and surface mobility of the particles is suppressed. That is, when an FeCo film is formed by sputtering (or deposition) while maintaining the wafer at a low temperature, an amorphous film is formed to form an MTJ, thus obtaining the same properties as those of the FeCoB/MgO/FeCoB multilayered structure.

As described above, a sputtering apparatus, which holds a wafer at a low temperature, is demanded. In order to realize sputtering in a low-temperature region, low-temperature control of a wafer holding table (wafer stage) is required. Low-temperature control of the wafer stage can be attained by directly attaching a refrigerator to a lower portion of the stage.

On the other hand, sputtering apparatuses adopt a so-called stationary deposition system in which the central axis of a wafer stage matches that of a sputtering cathode (or a sputtering target), and a multi-cathode film formation system in which a plurality of sputtering cathodes are attached to a wafer stage obliquely (or by offsetting the cathode central axes). Especially, the latter multi-cathode film formation system is popularly used since it can attain simultaneous sputtering using a plurality of targets, and can obtain a satisfactory film thickness distribution due to oblique incident film formation.

A case will be examined below wherein film formation is attained by the multi-cathode film formation system while maintaining a wafer at a very low temperature. In the multi-cathode film formation system, since a wafer center and target center are offset, a satisfactory film thickness distribution cannot be obtained unless the wafer is rotated.

Japanese Patent Laid-Open No. 2008-156746 discloses the following technique. That is, in an apparatus which performs sputtering while rotating a wafer, a cooler in which, for example, cooling water cooled to a predetermined temperature is circulated is connected to a wafer stage, and is rotated together with the wafer stage.

However, when a refrigerator having a high refrigerating capability such as a refrigerator using a GM (Gifford-McMahon) cycle is directly connected to a wafer stage so as to set the wafer stage at a very low temperature (for example, 100K or less), it is very difficult to rotate the wafer stage. For example, the GM cycle refrigerator requires a compressor and helium hose, and it is difficult to rotate the wafer stage together with them. A method of mechanically separating the refrigerator and wafer stage and rotating the wafer stage alone may be used. For example, Japanese Patent Laid-Open No. 2003-201565 discloses a deposition film forming apparatus comprising a substrate heating mechanism which includes a heater and is provided with a vacuum chamber, and a substrate holder which is rotatably provided on the substrate heating mechanism via a gap. If the heater is replaced with a cooling mechanism, there may be the following two problems. First, since the substrate holder is positioned between the cooling mechanism and substrate, the substrate can not be cooled unless the substrate holder falls in temperature. Secondly, if the substrate holder sufficiently falls in temperature, the temperature of the substrate can not be lowered to the temperature of the substrate holder due to the thermal resistance. These problems make a cooling efficiency of the substrate very worse.

According to the evaluation previously conducted for the aforementioned structure, the substrate holder made up of copper has a diameter of 200 mm and a thickness of 4 mm and disposed on the cooling mechanism at a space of 0.3 mm. When the cooling mechanism is cooled to 50K in vacuum for two hours, the substrate holder made up of copper kept at room temperature.

Two hours were required for cooling the substrate holder made up of copper to 120K by supplying argon gas with the space of 0.3 mm for cooling. The substrate could not be cooled to be more than 180K due to the thermal resistance between the substrate and holder even if the substrate is put on the cooled substrate holder made up of copper. That is, the aforementioned structure can not efficiently cool a wafer while rotating the wafer.

SUMMARY OF THE INVENTION

The present invention has been made in consideration of the aforementioned problems, and realizes a cooling technique that can efficiently cool a wafer while rotating the wafer.

In order to solve the above problems and to achieve the above object, a cooling system of the present invention is a cooling system for cooling a wafer in a vacuum chamber of a sputtering apparatus, comprising a wafer cooling stage which cools the wafer, a cooling mechanism which cools the wafer cooling stage, cooling gas supply units which introduces a cooling gas to the wafer cooling stage, a wafer rotating mechanism which holds the wafer in a state separated from the wafer cooling stage by a predetermined gap, and is rotated while holding the wafer, and a driving mechanism which rotates the wafer rotating mechanism at a predetermined rotational speed.

A sputtering apparatus of the present invention is a sputtering apparatus comprising a vacuum chamber to which a process gas is supplied, the cooling system which is arranged inside the vacuum chamber, and a cathode electrode which is arranged to face a wafer held on the cooling system, and applies a sputtering process to the wafer.

According to the present invention, since a wafer can be rotated while placing the wafer at a position adjacent to the wafer cooling stage that is cooled at a low temperature, rotation and cooling of the wafer can be simultaneously made.

Further features of the present invention will become apparent from the following description of exemplary embodiments (with reference to the attached drawings).

BRIEF DESCRIPTION OF THE DRAWINGS

FIGS. 4A to 4C are views showing the structure of a cooling gas channel formed in a wafer cooling stage shown in FIG. 1;

FIG. 5 is a view showing an example of the structure of a sputtering apparatus according to the second embodiment of the present invention;

FIGS. 6A to 6D are views showing an example of operations from a gripping operation to an unload operation of a wafer according to the second embodiment;

FIGS. 7A to 7C are views showing the detailed structure of a wafer cooling stage shown in FIG. 5;

FIGS. 10A and 10B are views when viewed from a IV-IV direction in FIG. 9;

DESCRIPTION OF THE EMBODIMENTS

Embodiments of the present invention will be described in detail hereinafter with reference to the accompanying drawings. Note that embodiments to be described hereinafter are examples upon realizing the present invention, and should be modified or changed as needed depending on the arrangements and various conditions of apparatuses to which the present invention is applied. Hence, the present invention is not limited to the following embodiments.

[First Embodiment]

Figure 1:
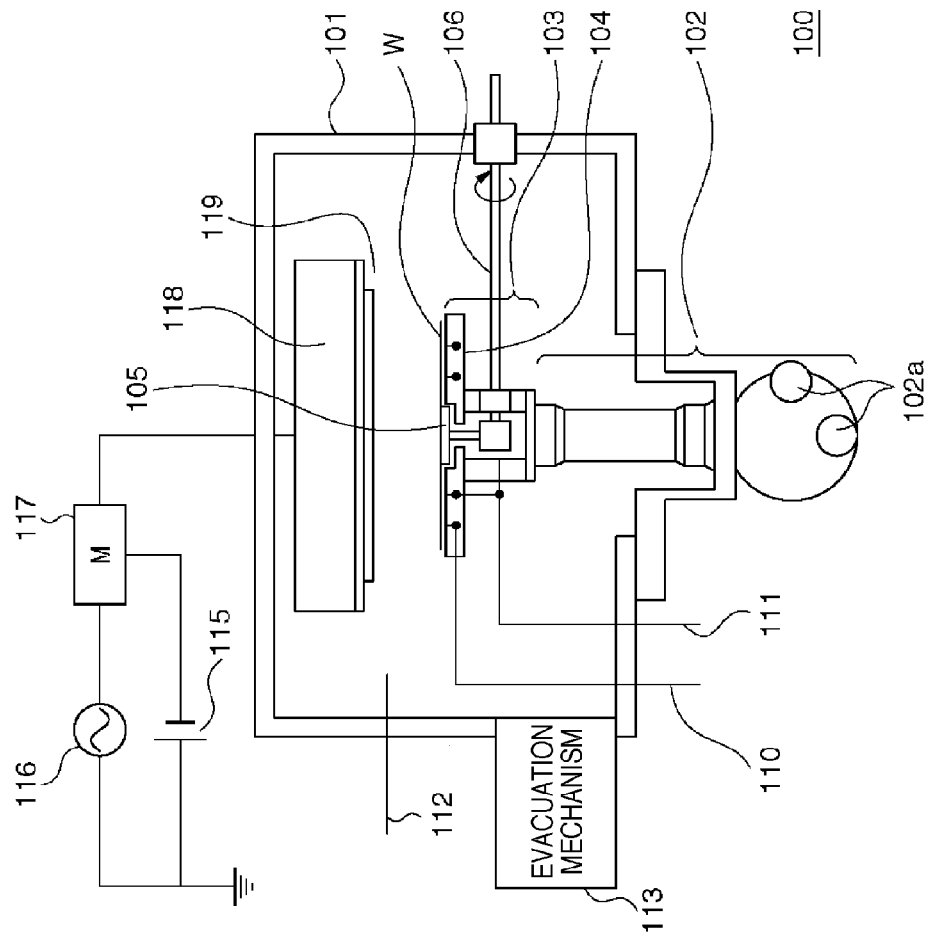
FIG. 1 is a view showing an example of the structure of a sputtering apparatus according to the first embodiment of the present invention.

FIG. 1 is a view showing an example of the structure of a sputtering apparatus according to the first embodiment of the present invention. Note that an exchange mechanism of a wafer W with an external portion is not shown. A sputtering apparatus 100 includes a sputtering cathode 118, sputtering target 119, and wafer holding stage 103 in a vacuum chamber 101.

In the vacuum chamber 101, a process gas supply line 112 is externally introduced, and a process gas required for sputter film formation is supplied from this line. The vacuum chamber 101 includes an evacuation mechanism 113 required to evacuate a process gas supplied from the process gas supply line 112 and an impurity gas from the vacuum chamber 101.

The sputtering cathode 118 is connected to a high-frequency power source 116 and DC power source 115 via a matching box 117. Then, one of only a high-frequency power, a power generated by superposing a high-frequency power and DC power, and only a DC power can be supplied to the sputtering cathode 118. As a matter of course, if no high-frequency discharge is required, only an electric power from the DC power source 115 may be supplied by omitting the matching box 117 and high-frequency power source 116.

The wafer holding stage 103 includes a wafer cooling stage 104 and wafer rotating stage 105, and a refrigerator 102 is connected to a lower portion of the wafer cooling stage 104. The refrigerator 102 is introduced with a refrigerant from a refrigerant introduction port 102a. In consideration of the refrigeration capability, the refrigerator 102 of a type using a GM (Gifford-McMahon) cycle is preferably used. To the wafer holding stage 103, a cooling gas can be introduced via a cooling gas supply line 110, and is introduced to an opposing face of the wafer W via a cooling gas channel formed inside the wafer cooling stage 104. Helium or hydrogen gas is preferably used as the cooling gas, in consideration of thermal conduction. Alternatively, a noble gas such as an argon or neon gas may be used. Furthermore, gasses used in a sputtering process may be used.

On the other hand, the cooling gas is evacuated outside the vacuum chamber 101 via a cooling gas discharge line 111 after the wafer W is cooled, or is discharged into the vacuum chamber 101 from a gap between the wafer cooling stage 104 and the wafer W, and is mixed with a process gas. As the cooling gas, the same gas as the process gas of the sputtering process is preferably used. Alternatively, a noble gas such as a helium gas having a high thermal conductivity may be used. The flow rate of the cooling gas at that time is preferably set to fall within the range from 3 sccm to 150 sccm. When the flow rate is smaller than 3 sccm, the cooling efficiency of the wafer lowers. Conversely, when the flow rate is larger than 150 sccm, the wafer W unwantedly floats by a pressure generated between the wafer W and wafer holding stage 103. However, when the wafer W is mechanically fixed like in, for example, the second embodiment to be described later, the flow rate can be set to be larger than 150 sccm.

Figure 2:
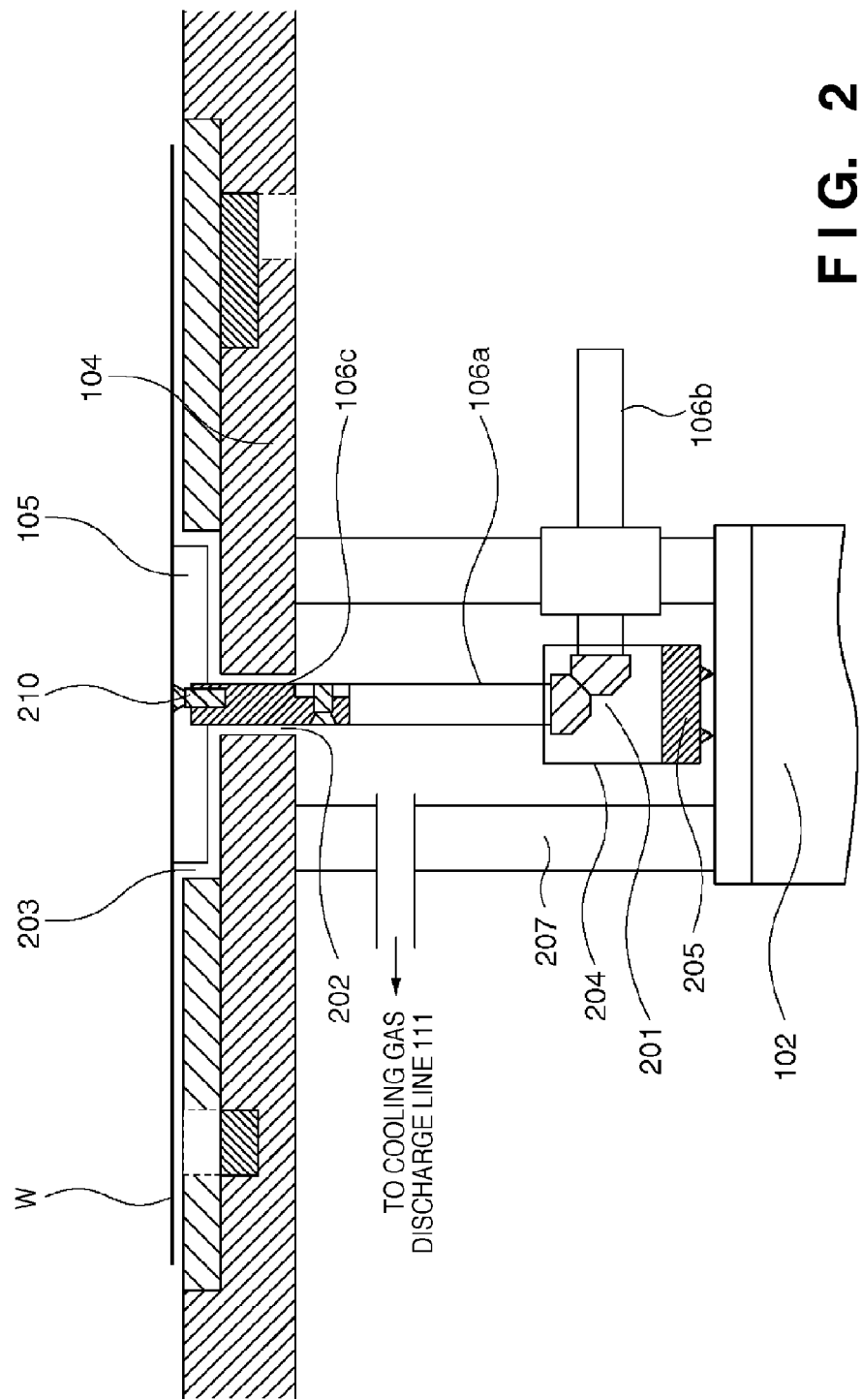
FIG. 2 is a view showing the detailed structure of a wafer holding stage shown in FIG. 1.

The detailed structure of the wafer holding stage 103 in FIG. 1 will be described below with reference to FIG. 2. As shown in FIG. 2, in the wafer cooling stage 104, a gas discharge hole 202 is formed as a through hole in its central portion, and a concave portion 203 is formed by spot facing. A first rotating shaft 106a is fixed to the disk-shaped wafer rotating stage 105 having an outer diameter smaller than the outermost diameter of this concave portion 203, and is coupled to a second rotating shaft 106b via bevel gears 201. The second rotating shaft 106b is connected to a power source such as a motor (not shown), and transfers the driving force of the motor to the wafer rotating stage 105. A wafer holding surface of the wafer rotating stage 105 slightly projects from the opposing surface on the wafer side of the wafer cooling stage 104, so that the wafer W placed on the wafer rotating stage 105 does not contact the wafer cooling stage 104. With this structure, the wafer W can be rotated while bringing the wafer W to be closer to the wafer cooling stage 104. When the projecting amount of the wafer rotating stage 105 is too small, the wafer W may contact the wafer cooling stage 104 at the time of rotation. When the projecting amount is too large, the wafer cooling stage 104 is separated from the wafer W to drop the cooling capability. In consideration of this situation, the projecting amount is preferably set to fall within the range from 0.2 mm to 1.5 mm. Note that a surface treatment is applied to the opposing surface on the wafer side of the wafer cooling stage 104 using a material having a high emissivity (emissivity >0.5), thus allowing to positively exchange a radiation heat.

A portion on the connection side with the wafer rotating stage 105 of the first rotating shaft 106a may be formed of a resin material (resin member 106c). When a material such as the resin material having a lower heat conductivity than a rotation transfer portion (in this case, a portion from a driving source to the bevel gears 201) that transfers a rotation from the driving source to the rotating shaft of the wafer rotating stage 105 is used, heat transfer from the rotation transfer portion to the wafer rotating stage 105 can be reduced. In this case, since a portion around the resin member is set at a very low temperature, a polyimide resin or polybenzimidazole (PBI) resin, which can be used at a very low temperature, is preferably used. A screw 210 is used to fix the first rotating shaft 106a and wafer rotating stage 105, and is offset from the central axis of the first rotating shaft 106a, thus suppressing the screw 210 from loosing due to rotation. The bevel gears 201 are covered by a gear case 204, which is fixed to the refrigerator 102 via a resin block 205. Then, the wafer rotating stage 105 can be stably held while suppressing heat transfer from the first rotating shaft 106a to the refrigerator 102.

Figure 3:
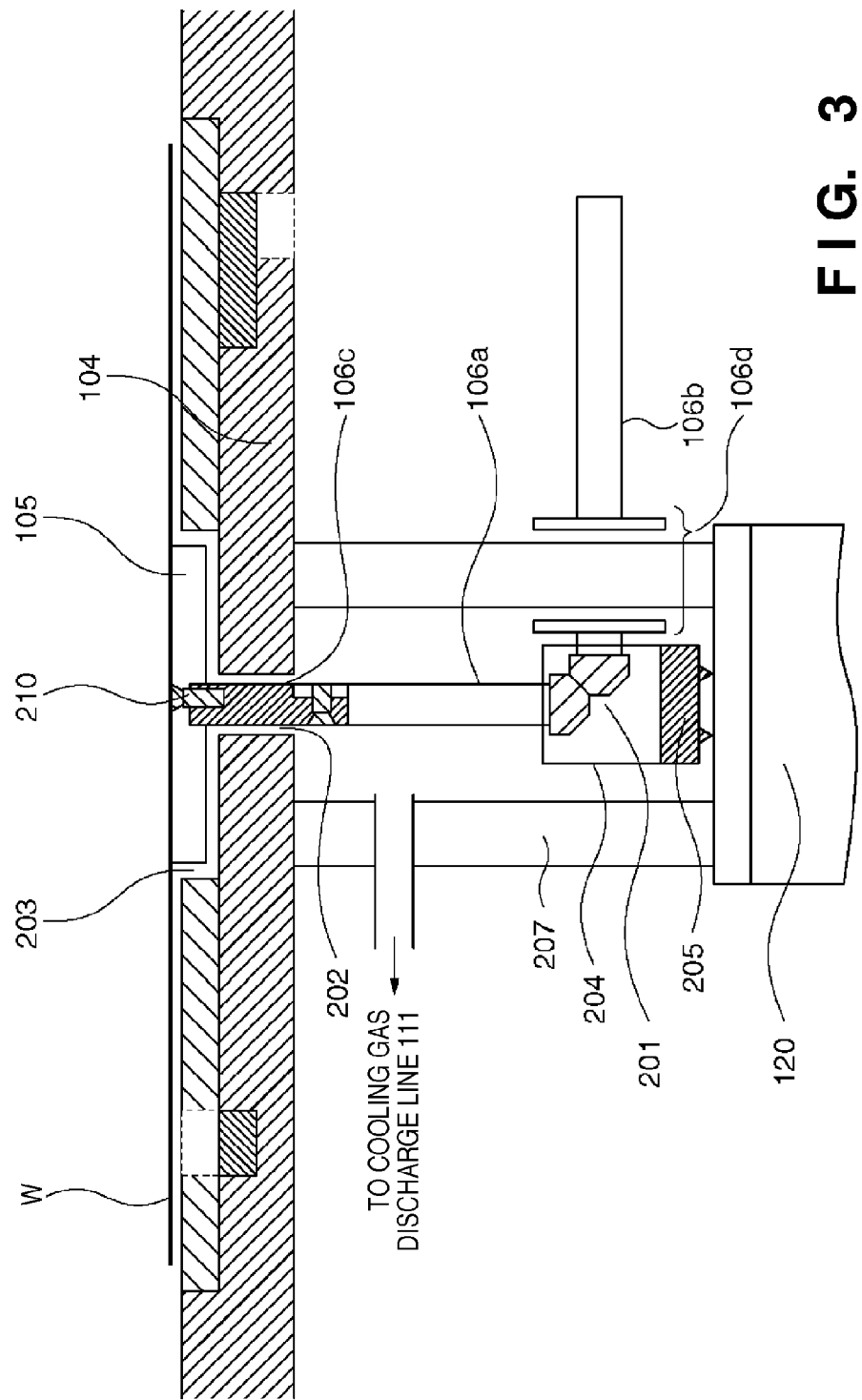
FIG. 3 is a view showing another detailed structure of the wafer holding stage shown in FIG. 1.

Note that the second rotating shaft 106b may use flat magnet couplings 106d, as shown in FIG. 3. As a result, the driving force from a power source such as a motor (not shown) can be transferred to the wafer rotating stage 105 without interfering with a part of the cooling gas channel communicating with the wafer cooling stage 104. Note that the same reference numerals in FIG. 3 denote the same elements as in FIG. 2.

The rotational speed of the wafer is decided depending on processes, film types, and required film quality, and so forth, and is not particularly limited upon application of the present invention. When a film is formed on the entire surface of the wafer, a rotational speed R or more is preferably set. The rotational speed R is given by:

$$R = 60/t [\text{rpm}] \quad (1)$$

When the rotational speed is smaller than a value given by equation (1), the wafer W cannot complete one revolution within a film formation time, and a region where no film is formed is generated.

The structure of the cooling gas channel formed in the wafer cooling stage 104 shown in FIG. 1 will be described below with reference to FIGS. 4A to 4C. Referring to FIGS. 4A to 4C, the wafer cooling stage 104 has a two-split structure of a wafer cooling stage base plate 408 and wafer cooling stage sealing plate 409, cooling gas introduction channels 403 and cooling gas ejection ports 401 are formed on the wafer cooling stage base plate 408 side by spot facing, and the wafer cooling stage sealing plate 409 is fixed to the upper portion of the base plate 408 by brazing or screwing, thus allowing to form the cooling gas channel. As a matter of course, on the wafer cooling stage base plate 408, a cooling gas supply line connection port 405 is formed as a through hole to allow to exchange a cooling gas with an external portion of the wafer cooling stage 104. Cooling gas ejection holes 407 are formed as through holes on the wafer cooling stage sealing plate 409. The wafer cooling stage sealing plate 409 is fixed to the wafer cooling stage base plate 408 after the cooling gas ejection ports 401 match the cooling gas ejection holes 407. In this embodiment, both cooling and rotation of the wafer W can be achieved by a relatively simple structure.

[Second Embodiment]

The second embodiment will be described below with reference to FIG. 5. FIG. 5 shows an example of the structure of a sputtering apparatus according to the second embodiment. A wafer rotating unit (501 to 506) is arranged outside a wafer cooling stage 104 in place of a wafer rotating stage 105, and holds a wafer.

Referring to FIG. 5, a wafer W is gripped while being clamped by a wafer base 508 and wafer chuck 501 in up-and-down directions. The wafer chuck 501 is fixed on a rotary base 502, and a bearing 506 is connected to a lower portion of the rotary base 502 via a column 504. A rotating gear 505 meshes with an outer-ring gear of the bearing 506, and a driving force is transferred via the rotating gear 505 rotated by a driving source 507, thereby rotating the wafer W. In the wafer rotating unit, an outer peripheral portion 104a of the wafer cooling stage 104 is spot-faced in consideration of an interference with the wafer base 508. Wafer pressing springs 511 are arranged between the wafer base 508 and rotary base 502, and clamp the wafer W at an appropriate force. Note that the same reference numerals in FIG. 5 denote the same elements as in FIG. 1.

FIGS. 6A to 6D show an example of operations from a gripping operation to an unload operation of the wafer W according to the second embodiment. FIG. 6A depicts a film formation complete state. At this time, the wafer W is gripped by the wafer base 508 and wafer chuck 501 by a force of the wafer pressing springs 511 at a position adjacent to the wafer cooling stage 104. FIG. 6B depicts a state in which the wafer base 508, wafer chuck 501, rotary base 502, wafer W, and wafer pressing springs 511 are moved upward by a lift mechanism 510. At this time, the wafer W is kept gripped by the force of the wafer pressing spring 511. FIG. 6C depicts a state in which the wafer base 508 is brought into contact with the wafer cooling stage 104 and its upward movement is stopped when the lift mechanism 510 further moves upward, but the rotary base 502 still moves upward to release gripping of the wafer W. FIG. 6D depicts a state in which the wafer W on the wafer base 508 is carried outside by a convey mechanism (not shown).

FIGS. 7A to 7C show an example of the detailed structure of the wafer cooling stage 104 of the second embodiment. The wafer cooling stage 104 has a two-split structure of a wafer cooling stage base plate 709 and wafer cooling stage sealing plate 710 in its thickness direction. The wafer cooling stage base plate 709 is formed with a concave portion 700 by spot facing on its inner periphery side, and can hold the wafer W by a convex portion on its outer periphery side. On the bottom surface of this concave portion 700, cooling gas ejection ports 701, cooling gas introduction channels 703, a gas supply line connection port 705 which makes the cooling gas supply channels 703 communicate with a cooling gas supply line 110, cooling gas discharge ports 702 formed on the inner periphery side of the cooling gas supply channels 703, a cooling gas discharge channel 704, and a cooling gas discharge line connection port 706 which makes the cooling gas discharge channel 704 communicate with a cooling gas discharge line 111 are formed. In FIGS. 7A to 7C, portions having different heights from the bottom surface of the concave portion are indicated by different hatching patterns.

The wafer cooling stage sealing plate 710 is fixed to the bottom surface of the concave portion of the wafer cooling stage base plate 709 by brazing or screwing, thus allowing to form a gas channel. On the wafer cooling stage sealing plate 710, cooling gas ejection holes 708, which communicate with the cooling gas introduction channels 703, and cooling gas discharge holes 707, which communicate with the cooling gas discharge channel 704, are formed as through holes.

In this way, since the wafer cooling stage 104 has the two-split structure, and grooves are formed to provide branch channels, a degree of freedom in design can be enhanced, and an apparatus having a higher cooling effect can be configured. For example, in the example shown in FIGS. 7A to 7C, the lengths of channels extending from the gas supply line connection port 705 to the respective cooling gas ejection holes 708 are set to be substantially equal to each other (within a range of a relative difference (a difference from a median/the median) ±5%), and the lengths of branch channels from the connection port 705 are set to be equal to each other. As for the cooling gas discharge channel 704, the lengths of the branch channels are similarly set to be substantially equal to each other (within a range of a relative difference (a difference from a median/the median) ±5%). Thus, variations of dispersion of a cooling gas can be prevented.

Note that the present invention is not limited to the case in which the lengths of the branch channels are equally set. For example, since the temperature of a member easily lowers near an entrance used to bring the wafer W into a vacuum chamber 101, branch channels which have openings closer to the wafer entrance may be set to be longer or narrower than those which have openings farther away from the entrance so as to have a smaller conductance. As for a portion where a steady cooling efficiency difference is generated in this way, the branch channels are adjusted rather than independent control of separate gas channels, thus simply attaining an even cooling effect at low cost. Likewise, when the gas channels are formed on the outer and inner periphery sides of the wafer cooling stage 104, the branch channels on the inner periphery side are set to be longer or narrower so as to have a smaller conductance, thus obtaining the same effect.

In the second embodiment, since the wafer rotating unit is arranged outside the wafer cooling stage 104, the wafer W can be cooled using the entire surface of the wafer cooling stage 104. Then, since the outer edge portion of the wafer W is mechanically gripped, the wafer rotational speed can be increased to 180 rpm or higher. As a result, the wafer can be efficiently cooled while being rotated at high speed.

[Third Embodiment]

Figure 8:
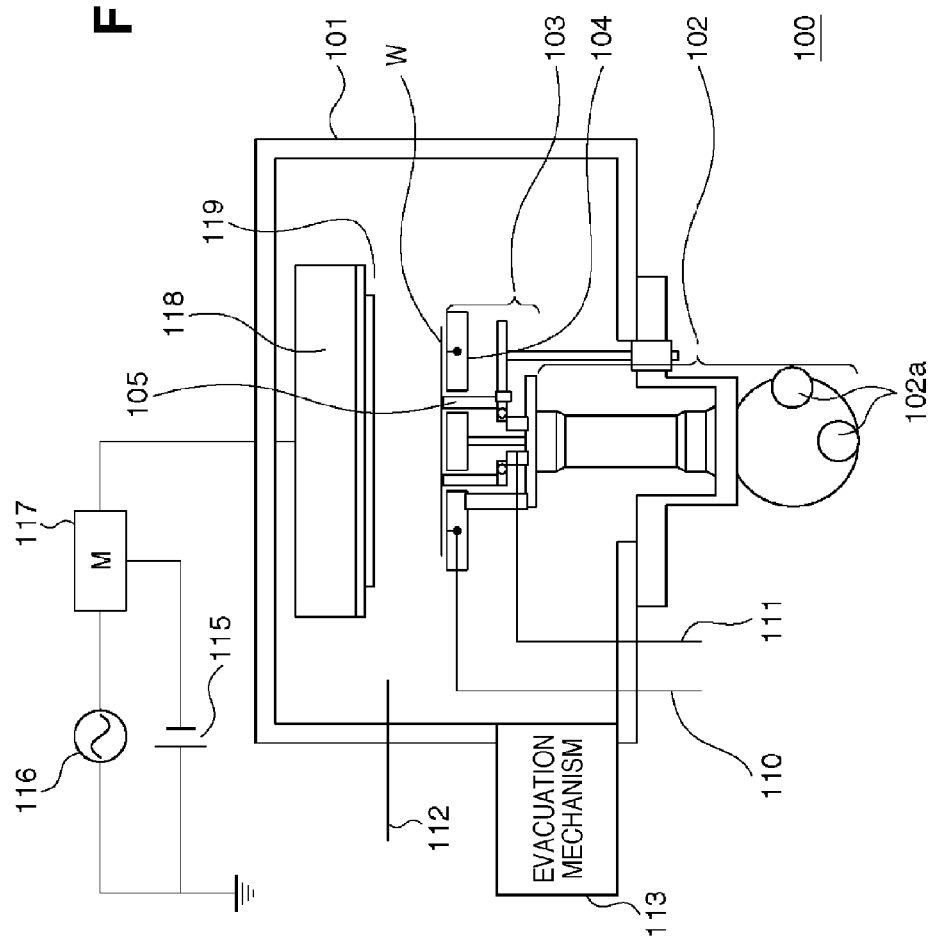
FIG. 8 is a view showing an example of the structure of a sputtering apparatus according to the third embodiment of the present invention.

The third embodiment will be described below with reference to FIGS. 8 and 9. In FIG. 8, a wafer rotating stage 105 is concentrically arranged on a portion separated from the center of a wafer cooling stage 104 toward the outer periphery side by a predetermined distance. Note that an exchange mechanism of a wafer W with an external portion is not shown. Also, the same reference numerals in FIG. 8 denote the same elements as in FIG. 1.

Figure 9:
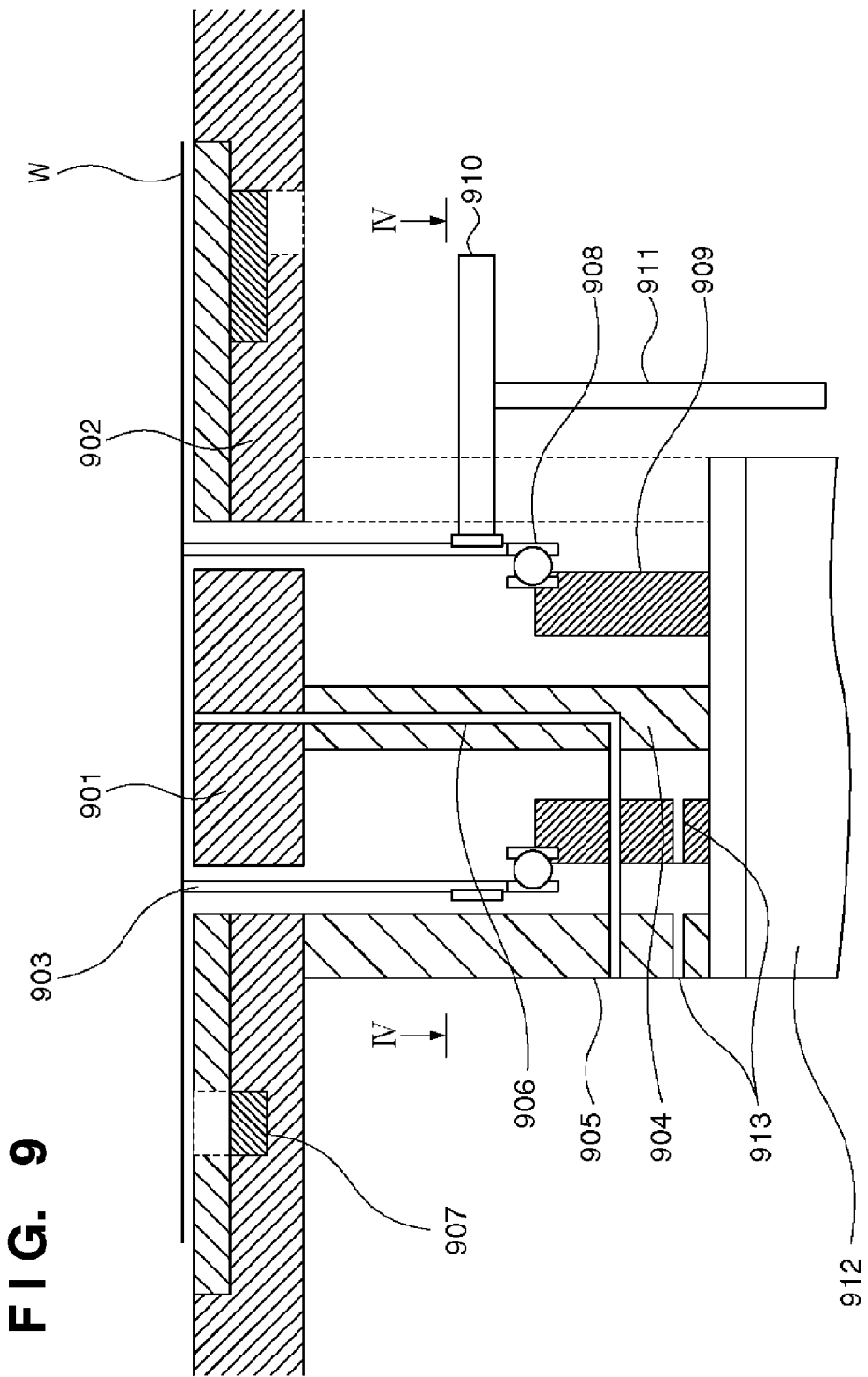
FIG. 9 is a view showing the detailed structure of a wafer holding stage shown in FIG. 8.

FIG. 9 shows an example of the detailed structure of a wafer holding stage 103 in FIG. 8. Referring to FIG. 9, the wafer cooling stage 104 includes a disk-shaped first wafer cooling stage 901 which is fixed on a refrigerator 912 via a first thermal conduction block 904, and a ring-shaped second wafer cooling stage 902 which is fixed on the refrigerator 912 via a second thermal conduction block 905. A predetermined gap is formed between the first and second wafer cooling stages 901 and 902, and a wafer rotating stage 903 is arranged in this gap so as not to contact the first and second wafer cooling stages 901 and 902.

A bearing 908 fixed to a resin block 909 is connected below the wafer rotating stage 903. The resin block 909 has a role of fixing the bearing 908, and a role of eliminating any contraction deformation of components due to a very low temperature by suppressing heat transfer from a bearing member and gears. As a matter of course, if components which suffer less deformations at a very low temperature are selected, the resin block 909 may be replaced by a metal component. A rotary gear 910 fixed to a rotating shaft 911 which transfers a driving force from a power source (not shown) meshes with a gear formed on the outer periphery portion of the wafer rotating stage 903, so that the wafer rotating stage 903 is rotatable by the power source (not shown) without contacting the first and second wafer cooling stages 901 and 902.

A cooling gas is introduced via first and second cooling gas introduction paths 906 and 907, and flows into a gap between the back surface of the wafer W and the first and second wafer cooling stages 901 and 902. Note that a cooling gas ejected from the first wafer cooling stage 901 is discharged from a cooling gas discharge path 913.

FIG. 10A is a view when viewed from a IV-IV direction in FIG. 9. The second thermal conduction block 905 is notched in the circumferential direction so as not to contact the rotary gear 910. A notch amount of the second thermal conduction block 905 in a normal direction to a wafer plane may correspond to a full height or only a non-contact range with the rotary gear 910. When magnet couplings 930 are used in place of the rotary gear, as shown in FIG. 10B, the wafer rotating stage 903 can be rotated without notching the second thermal conduction block 905.

Figures 11A, 11B, 11C:
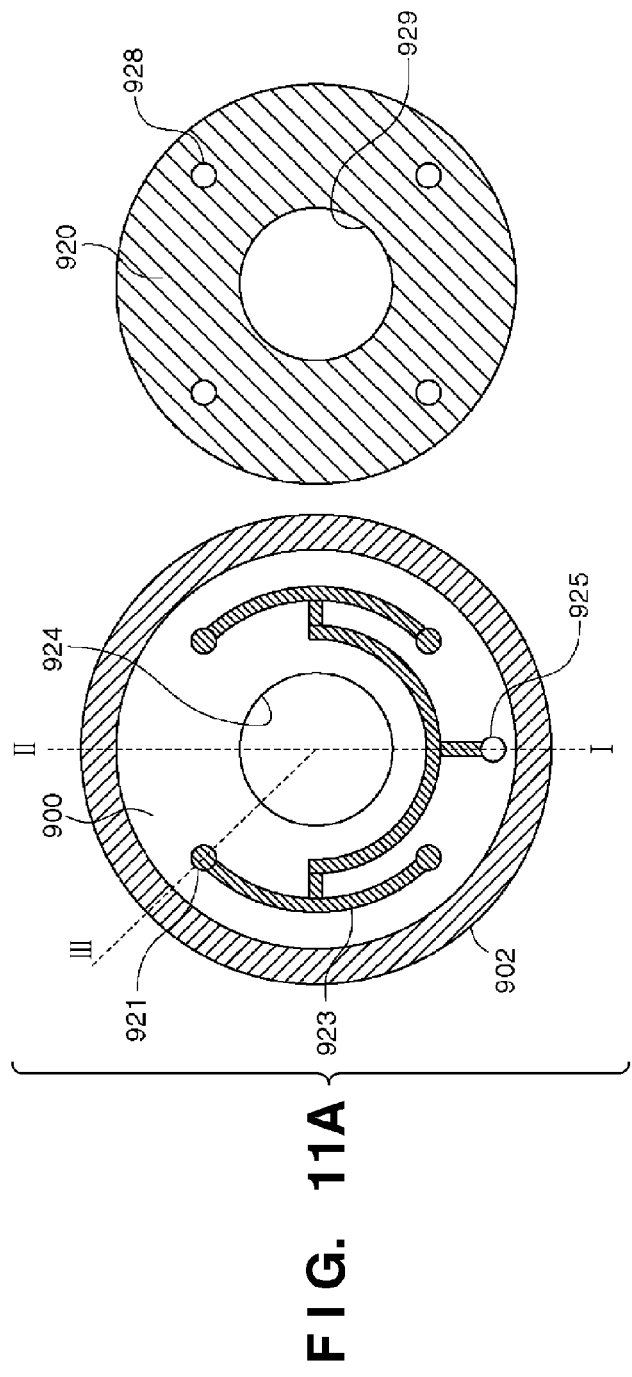
FIGS. 11A to 11C are views showing the detailed structure of a wafer cooling stage shown in FIG. 8.

FIGS. 11A to 11C show an example of the detailed structure of the wafer cooling stage according to the third embodiment. A concave portion 900 is formed on the inner periphery side of the second wafer cooling stage 902 by spot facing, and a central hole 924 having a diameter larger than the outermost diameter of the wafer rotating stage 903 is formed as a through hole in the central portion. In the second wafer cooling stage 902, cooling gas ejection ports 921, cooling gas introduction channels 923, and a cooling gas supply line connection port 925 are formed. By fixing a wafer cooling stage sealing plate 920 to the concave portion by brazing or screwing, cooling gas channels can be formed. On the wafer cooling stage sealing plate 920, cooling gas ejection holes 928 which communicate with the cooling gas ejection ports 921, and a central hole 929 which communicates with the central hole 924 are formed as through holes.

The third embodiment is excellent in the following points. That is, the wafer can be stably held while suppressing the sizes of components associated with the wafer rotating stage, and the thickness in the radial direction of the wafer rotating stage can be reduced. Hence, the area ratio of the wafer cooling stage can be increased, thus enhancing the wafer cooling efficiency.

EXAMPLE 1

The wafer cooling confirmation was conducted for the structure of the first embodiment. The wafer W is an AlTiC (Aluminum-Titanium Carbide) wafer having a diameter of 200 mm and a thickness of 1.2 mm. The wafer cooling stage 104 is made up of copper, and an outermost shape has a diameter of 205 mm. A through hole having a diameter of 15 mm and a spot-faced portion having a diameter of 35 mm and a predetermined depth are formed at the center of the wafer cooling stage 104. The resin member 106c is made up of a polyimide resin. To the distal end portion of the first rotating shaft 106a, the copper wafer rotating stage 105 having a diameter of 33 mm is fixed, and is rotatable without contacting the wafer cooling stage 104. Note that a gap between the wafer W and wafer cooling stage 104 at this time is 0.3 mm.

A GM cycle refrigerator is used as the refrigerator 102, and the wafer cooling stage 104 and refrigerator 102 are connected via a thermal conduction block 207, whose surface has undergone an Ni plating gloss treatment so as to reduce any radiation.

On the other hand, the cooling gas ejection holes 407 are formed at four 90°-angular positions each having a radius of 70 mm from the center in the wafer cooling stage 104.

In the above structure, the wafer cooling stage 104 was cooled to 50K. Note that the temperature of the wafer cooling stage 104 can be measured in real time by a platinum resistor element fixed to the cooling stage. The AlTiC wafer W was placed on the wafer cooling stage 104/wafer rotating stage 105, and the wafer rotating stage was rotated at 90 rpm for 20 minutes while supplying an He cooling gas at 50 sccm. Then, the wafer temperature fell to 105K, as shown in Table 1, and the effects of the present invention could be confirmed.

TABLE 1

| Gas flow rate [sccm] | Rotational speed [rpm] | Cooling time [min] | Wafer temperature [K] |
|---|---|---|---|
| 1 | 90 | 20 | 200 |
| 3 | 90 | 20 | 150 |
| 20 | 90 | 20 | 115 |
| 50 | 90 | 20 | 105 |
| 150 | 90 | 20 | 102 |

Figure 12:
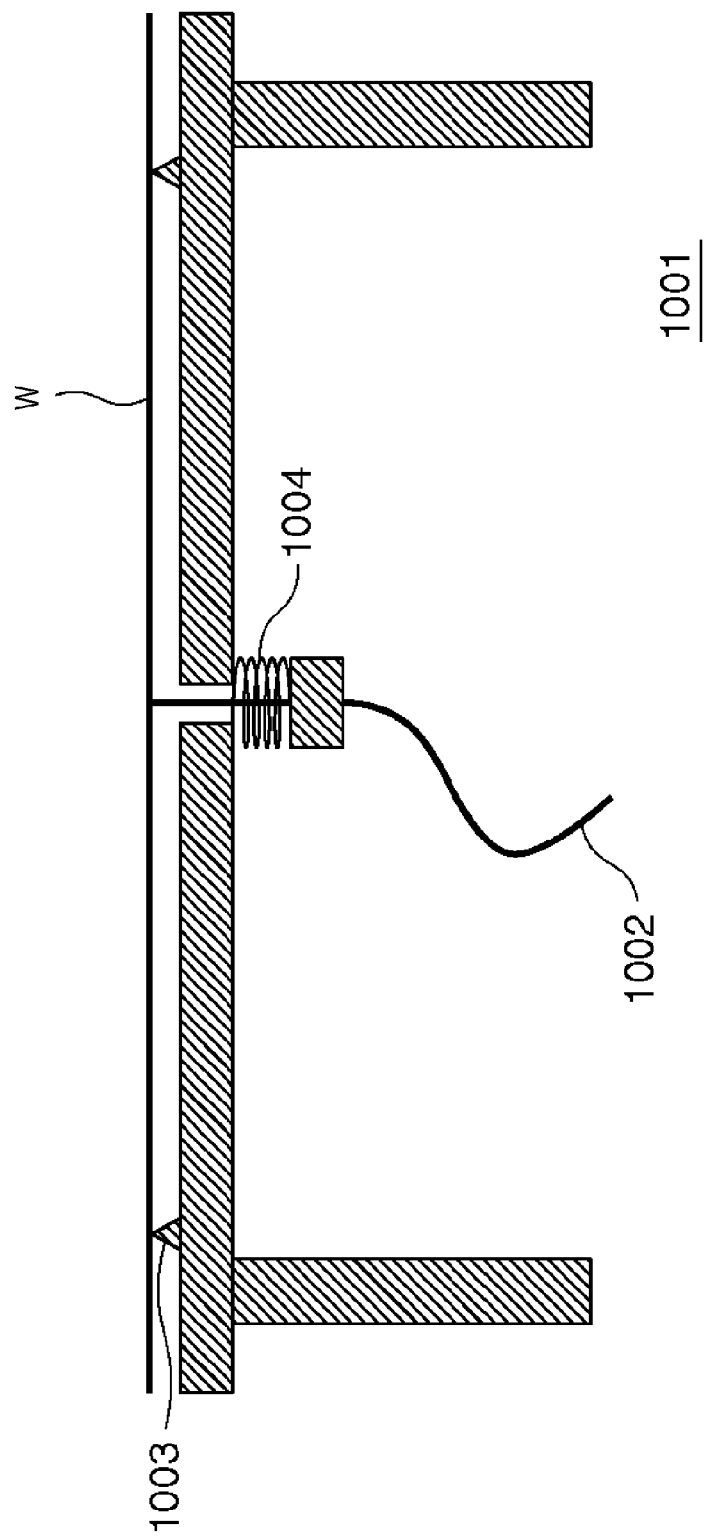
FIG. 12 is a view showing the structure of a resin stage used to measure a wafer temperature.

Note that a thermocouple could not be attached to the rotating wafer W so as to measure the temperature of the wafer W. Hence, the temperature of the wafer W was measured as follows. As shown in FIG. 12, a wafer placing ring 1003 having a height of 1 mm was formed on a polyimide-resin stage 1001, and a platinum resistor element 1002 was fixed to the central portion of the stage 1001 via a spring 1004 to be exposed on the wafer side. A vacuum chamber including the stage 1001 communicates with a vacuum chamber to which the present invention is applicable and includes a wafer cooling stage via a convey process chamber including a convey mechanism (not shown).

The platinum resistor element 1002 is exposed from the surface of the stage 1001 by 2 mm. The wafer W, which was rotated/cooled by the wafer cooling stage 104 and wafer rotating stage 105, is placed on the stage 1001 by the convey mechanism (not shown). At this time, the platinum resistor element is surely brought into contact with the wafer W by a contraction force of the spring 1004 which is generated simultaneously when the spring 1004 expands due to the weight of the wafer W, thus allowing to measure the wafer temperature.

EXAMPLE 2

The wafer cooling confirmation was conducted for the structure of the second embodiment. The wafer W is an AlTiC (Aluminum-Titanium Carbide) wafer having a diameter of 200 mm and a thickness of 1.2 mm. The wafer cooling stage 104 has a convex shape made up of copper, an outermost shape has a diameter of 220 mm, and a convex portion has a diameter of 190 mm. A gripping range of the wafer W by the wafer chuck 501 corresponds to an inward range of 3 mm from the outer side of the wafer W. This is because when this range is larger than 3 mm, a pattern, which is to be formed/is actually formed on the wafer W, cannot undergo film formation. Note that a gap between the convex portion surface of the wafer cooling stage 104 and the back surface of the wafer W is 0.3 mm. On the wafer cooling stage 104, the cooling gas ejection holes 708 are formed at 90°-angular positions each having a predetermined radius from the center. Also, the cooling gas discharge holes 707 are formed at 90°-angular positions each having a predetermined radius from the center on the inner side of the cooling gas ejection holes 708.

In the above structure, the wafer cooling stage 104 was cooled to 50K. Note that the temperature of the wafer cooling stage 104 can be measured in real time by a platinum resistor element fixed to the cooling stage. The AlTiC wafer W was placed on the wafer cooling stage 104/wafer rotating stage 105, and the wafer rotating stage was rotated at 180 rpm for 20 minutes while supplying an He cooling gas at 50 sccm. Then, the wafer temperature fell to 98K, as shown in Table 2, and the effects of the present invention could be confirmed.

TABLE 2

| Gas flow rate [sccm] | Rotational speed [rpm] | Cooling time [min] | Wafer temperature [K] |
|---|---|---|---|
| 1 | 180 | 20 | 180 |
| 3 | 180 | 20 | 123 |
| 20 | 180 | 20 | 102 |
| 50 | 180 | 20 | 98 |
| 150 | 180 | 20 | 96 |

The reason why the wafer temperature is lower than Example 1 is that the effective cooling area of the wafer cooling stage 104 of the second embodiment is larger than the first embodiment to attain more efficient cooling.

EXAMPLE 3

The wafer cooling confirmation was conducted for the structure of the third embodiment. The wafer W is an AlTiC (Aluminum-Titanium Carbide) wafer having a diameter of 200 mm and a thickness of 1.2 mm. The first wafer cooling stage 901 is made up of copper, has a diameter of 33 mm, and is cooled via the first thermal conduction block 904. The second wafer cooling stage 902 is made up of copper, a through hole is formed in a central region having a diameter of 41 mm, and the stage 902 has a diameter of 205 mm. The second wafer cooling stage 902 is cooled via the second thermal conduction block 905, and both the first and second wafer cooling stages 901 and 902 were cooled to 50K.

A gap between the first and second wafer cooling stages 901 and 902 is set to be 4 mm, and the wafer rotating stage 903 which has a thickness of 2 mm and an inner diameter of 35 mm, and is made up of SUS310 is set in this gap. Note that on the second wafer cooling stage 902, the cooling gas ejection holes 928 are formed at 90°-angular positions each having a predetermined radius from the center.

In the above structure, the second wafer cooling stage 902 was cooled to 50K. When the wafer rotating stage 903 was rotated at 120 rpm for 20 minutes while supplying an He cooling gas at 50 sccm, the wafer temperature fell to 103K, as shown in Table 3, and the effects of the present invention could be confirmed.

TABLE 3

| Gas flow rate [sccm] | Rotational speed [rpm] | Cooling time [min] | Wafer temperature [K] |
|---|---|---|---|
| 1 | 120 | 20 | 193 |
| 3 | 120 | 20 | 140 |

TABLE 3-continued

| Gas flow rate [sccm] | Rotational speed [rpm] | Cooling time [min] | Wafer temperature [K] |
|---|---|---|---|
| 20 | 120 | 20 | 108 |
| 50 | 120 | 20 | 103 |
| 150 | 120 | 20 | 100 |

The preferred embodiments of the present invention have been described. However, these embodiments are examples for the purpose of the description of the present invention. Hence, the present invention is applicable to wafers having different sizes and types.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-296350 filed Dec. 25, 2009, which is hereby incorporated by reference herein in its entirety.

What is claimed is:

1. A cooling system for cooling a wafer to be processed, comprising:
    a refrigerator;
    a wafer cooling stage which is connected to said refrigerator, and has cooling gas ejection holes directed toward a non-process surface of the wafer;
    a cooling gas supply unit which introduces a cooling gas to said wafer cooling stage;
    a wafer rotating mechanism which holds the wafer in a state separated from said wafer cooling stage by a predetermined gap, and is rotated while holding the wafer; and
    a driving mechanism which rotates the wafer rotating mechanism.

2. The system according to claim 1, wherein said wafer rotating mechanism is disposed on a concave portion formed on a central portion of said wafer cooling stage.

3. The system according to claim 1, wherein said wafer rotating mechanism is coupled to a rotating shaft of said driving mechanism via a resin member.

4. The system according to claim 1, wherein said wafer cooling stage is coupled to said refrigerator via a thermal conduction member.

5. The system according to claim 1, wherein said wafer rotating mechanism has a gripping mechanism which is arranged on an outer peripheral portion of said wafer cooling stage and grips an outer periphery of the wafer, and is operable between a first position where said wafer rotating mechanism grips the wafer and makes the wafer be closer to said wafer cooling stage by the predetermined gap, and a second position where said wafer rotating mechanism releases gripping of the wafer to allow the wafer to be unloaded.

6. The system according to claim 5, wherein said gripping mechanism is rotated while gripping the outer periphery of the wafer.

7. The system according to claim 1, wherein said wafer cooling stage has a disk-shaped first cooling stage as a central portion, and a ring-shaped second cooling stage which is disposed on an outer peripheral portion of said first cooling stage to have a gap,
    said wafer rotating mechanism has a rotary member which is disposed in the gap so as not to contact said first cooling stage and said second cooling stage, and
    said rotary member holds the wafer in a state separated from said first cooling stage and said second cooling stage by the predetermined gap, and is rotated while holding the wafer.

8. The system according to claim 1, wherein said wafer cooling stage is formed with an introduction port required to introduce a cooling gas supplied from outside of a vacuum chamber, an introduction channel required to distribute the cooling gas inside said wafer cooling stage, and ejection ports required to eject the cooling gas toward the wafer.

9. The system according to claim 8, wherein the introduction port, the introduction channel, and the ejection ports are formed at the same positions in a thickness direction of said wafer cooling stage.

10. The system according to claim 9, wherein the introduction channel has branch channels formed to have the same distance from the introduction port.

11. The system according to claim 8, wherein the cooling gas ejected from the ejection ports are discharged into the vacuum chamber via the gap between said wafer rotating mechanism and said wafer cooling stage.

12. A sputtering apparatus comprising:
    a vacuum chamber to which a process gas is supplied;
    a cooling system according to claim 1, which is arranged inside said vacuum chamber; and
    a cathode electrode which is arranged to face a wafer held on said cooling system, and applies a sputtering process to the wafer.

* * * * *